United States Patent
Go et al.

(10) Patent No.: US 10,860,455 B2
(45) Date of Patent: Dec. 8, 2020

(54) STORAGE DEVICE FOR GENERATING TRACE DATA AND METHOD OF OPERATING THE SAME

(71) Applicant: Samsung Electronics Co., Ltd., Suwon-si (KR)

(72) Inventors: Gwang-ok Go, Suwon-si (KR); Pil-Chang Son, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 15/647,629

(22) Filed: Jul. 12, 2017

(65) Prior Publication Data

US 2018/0138090 A1    May 17, 2018

(30) Foreign Application Priority Data

Nov. 15, 2016 (KR) .......................... 10-2016-0152235

(51) Int. Cl.
  *G06F 11/00* (2006.01)
  *G06F 11/34* (2006.01)
(52) U.S. Cl.
  CPC ...... *G06F 11/3466* (2013.01); *G06F 11/3476* (2013.01)
(58) Field of Classification Search
  CPC .................... G06F 11/3466; G06F 11/3476
  See application file for complete search history.

(56) References Cited

U.S. PATENT DOCUMENTS

| 6,134,676 | A | * | 10/2000 | VanHuben | G06F 11/3466 714/39 |
| 6,167,536 | A | * | 12/2000 | Mann | G06F 11/3419 714/45 |
| 6,467,083 | B1 | * | 10/2002 | Yamashita | G06F 11/3466 711/156 |
| 6,769,054 | B1 | * | 7/2004 | Sahin | G06F 11/3466 711/162 |
| 6,826,717 | B1 | | 11/2004 | Draper et al. | |
| 7,197,671 | B2 | | 3/2007 | Swaine et al. | |
| 7,679,133 | B2 | | 3/2010 | Son et al. | |
| 7,702,964 | B2 | | 4/2010 | John | |
| 7,797,585 | B1 | * | 9/2010 | Sahin | G06F 11/3409 714/45 |
| 8,370,687 | B2 | | 2/2013 | Pedersen et al. | |
| 8,553,466 | B2 | | 10/2013 | Han et al. | |

(Continued)

FOREIGN PATENT DOCUMENTS

JP    2002-108641 A    4/2002
JP    5722086 B2    5/2015

*Primary Examiner* — Joshua P Lottich
(74) *Attorney, Agent, or Firm* — Harness, Dickey & Pierce, P.L.C.

(57) ABSTRACT

A storage device and a method of operating the storage device are provided. The storage device includes a non-volatile memory including a plurality of non-volatile memory cells, a processor configured to control an operation of storing data received from a host in the non-volatile memory, a host interface configured to transmit and receive the data and control signals to and from the host, and a trace module. The trace module is configured to generate trace data for the processor or the host interface during an operation of the processor or the host interface and the trace module is configured to provide the trace data to the non-volatile memory.

19 Claims, 21 Drawing Sheets

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 8,978,017 B2 | 3/2015 | Sohm et al. |
| 9,088,433 B2 | 7/2015 | Roettgermann et al. |
| 9,223,678 B2 | 12/2015 | Moyer et al. |
| 9,377,507 B2 | 6/2016 | Kilzer et al. |
| 2002/0120815 A1* | 8/2002 | Zahavi ................ G06F 11/3034 711/118 |
| 2003/0061550 A1* | 3/2003 | Ng ...................... G06F 11/3664 714/45 |
| 2006/0224928 A1* | 10/2006 | Cardinell ............ G06F 11/3476 714/45 |
| 2006/0259824 A1* | 11/2006 | Sohm ................... G06F 11/323 714/38.13 |
| 2007/0220361 A1 | 9/2007 | Barnum et al. |
| 2008/0059844 A1* | 3/2008 | Miyamoto .......... G06F 11/0727 714/45 |
| 2008/0195793 A1 | 8/2008 | Noha et al. |
| 2008/0244327 A1* | 10/2008 | Coombes ............ G06F 11/348 714/45 |
| 2010/0083052 A1* | 4/2010 | Huber ................ G06F 11/0709 714/45 |
| 2011/0233648 A1 | 9/2011 | Seol et al. |
| 2012/0095728 A1* | 4/2012 | Ubukata ............. G06F 11/3409 702/186 |
| 2015/0127992 A1* | 5/2015 | Sankar ................ G06F 11/3003 714/45 |
| 2015/0127993 A1* | 5/2015 | Sankar ................ G06F 11/3466 714/45 |
| 2015/0127994 A1* | 5/2015 | Sankar ................ G06F 11/3636 714/45 |
| 2015/0220393 A1 | 8/2015 | Broderick et al. |
| 2015/0347325 A1* | 12/2015 | Hutchison ............... G06F 13/10 710/19 |
| 2016/0232073 A1 | 8/2016 | Cook et al. |
| 2016/0266795 A1* | 9/2016 | Woo ...................... G06F 3/061 |
| 2017/0011805 A1* | 1/2017 | Hong ..................... G11C 16/28 |
| 2017/0075685 A1* | 3/2017 | Grant ........................ G06F 8/70 |
| 2017/0177460 A1* | 6/2017 | Neiger ................... G06F 3/0604 |
| 2017/0220406 A1* | 8/2017 | Parnell ................ G06F 11/0778 |
| 2018/0041411 A1* | 2/2018 | Shaked ............... H04L 67/1097 |

* cited by examiner

STORAGE DEVICE FOR GENERATING TRACE DATA AND METHOD OF OPERATING THE SAME

CROSS-REFERENCE TO RELATED APPLICATION

This application claims the benefit of Korean Patent Application No. 10-2016-0152235, filed on Nov. 15, 2016, in the Korean Intellectual Property Office, the disclosure of which is incorporated herein in its entirety by reference.

BACKGROUND

The inventive concepts relate to a semiconductor device, and more particularly, to a storage device including a non-volatile memory, and a method of operating the storage device.

Flash memory, which is non-volatile memory, can maintain data stored therein even though powered off. Flash memory-containing storage devices, such as solid state drives (SSDs) and memory cards, are being widely used, and storage devices are usefully used to store or transfer a large amount of data.

When an error condition occurs in a storage device (or storage system), a user may trace the operation of each of, or at least some of, the components of the storage device or transmission/reception signals between the components to generate trace data, and may detect and/or detect and correct errors by analyzing the trace data.

SUMMARY

Inventive concepts provide a storage device that generates and stores trace data without involving an external device when an error condition occurs in a storage system.

Inventive concepts also provide a method of operating the storage device.

According to some example embodiments of inventive concepts, a storage device may include a non-volatile memory including a plurality of non-volatile memory cells, a processor that configured to control an operation of storing data received from a host in the non-volatile memory, a host interface configured to transmit and receive the data and control signals to and from the host, and a trace module configured to generate trace data for the processor or the host interface during an operation of the processor or the host interface. The trace module may be configured to provide the trace data to the non-volatile memory.

According to some example embodiments of inventive concepts, a storage controller may include a plurality of intellectual properties (IPs) and a non-volatile memory. The storage controller may be configured to generate trace data for at least one of the plurality of IPs, and the storage controller may be configured to output the trace data. The non-volatile memory may be configured to store user data provided from a host and the trace data provided from the storage controller.

According to some example embodiments of inventive concepts, a storage controller may include a plurality of intellectual properties (IPs) and a trace module. The plurality of IPs may include a processor configured to control storing data in a non-volatile memory in response to a write request received from a host. The plurality of IPs may include a host interface configured to transmit and to receive the data and control signals to and from the host. The trace module may be configured to generate trace data based on tracing an operation or transmission/reception signal of at least one of the plurality of IPs. The trace module may be configured to provide the trace data to the non-volatile memory.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
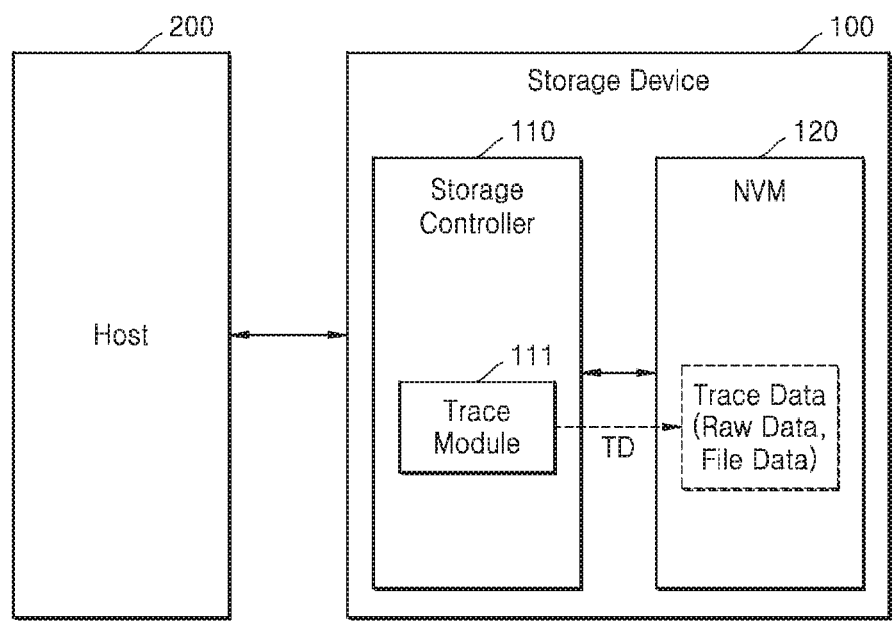
FIG. 1 is a block diagram of a storage system according to an example embodiment.

Hereinafter, example embodiments of inventive concepts will be described in detail with reference to the accompanying drawings. Like reference numerals in the drawings denote like elements.

FIG. 1 is a block diagram of a storage system 10 according to an example embodiment.

The storage system 10 may be implemented as an electronic device, such as a personal computer (PC), a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, or an e-book. The storage system 10 may also be implemented as an electronic device, such as a wearable device such as a wristwatch or a head-mounted display (HMD). However, inventive concepts are not limited thereto.

Referring to FIG. 1, the storage system 10 includes a storage device 100 and a host 200. The storage device 100 may include a storage controller 110 and a non-volatile memory 120. The storage controller 110 and the non-volatile memory 120 may be integrated together.

The host 200 may provide a data access request to the storage device 100. For example, the host 200 may provide a data write or read request to the storage device 100, and the storage device 100 may write data to the non-volatile memory 120 or read data from the non-volatile memory 120 to provide the read data to the host 200, in response to an access request from the host 200. Additionally or alternatively, in response to a data erase request from the host 200, the storage device 100 may perform an erase operation on data in an area indicated by the host 200.

The host 200 may communicate with the storage device 100 through various interfaces. The host 200 may include various types of devices capable of performing data access to the storage device 100. For example, the host 200 may be an application processor (AP) that communicates with the storage device 100, which is a flash memory-based storage device. The host 200 may communicate with the storage device 100 through various types of interfaces.

The non-volatile memory 120 may include a plurality of memory blocks. Each of, or at least some of, the plurality of memory blocks may include a memory cell array including a plurality of memory cells. For example, the plurality of memory cells may be flash memory cells. Hereinafter, example embodiments of the inventive concepts will be described by taking as an example the case where the plurality of memory cells are NAND flash memory cells. However, the inventive concepts are not limited thereto, and the plurality of memory cells may be various other types of non-volatile memory cells. In an example embodiment, the plurality of memory cells may be resistive memory cells such as resistive RAM (RRAM), phase change RAM (PRAM), or magnetic RAM (MRAM); however, inventive concepts are not limited thereto.

The non-volatile memory 120 may include a two-dimensional (2D) memory cell array, or a three-dimensional (3D) memory cell array. The 3D memory cell array may be monolithically formed in at least one physical level of memory cell arrays having an active region disposed above a silicon substrate and a circuit formed on the silicon substrate or in the silicon substrate as a circuit related to the operation of memory cells. The term "monolithic" indicates that layers of each level of the memory cell array are stacked directly on layers of each lower level of the memory cell array.

In an example embodiment, the 3D memory cell array may include cell strings arranged in a vertical direction so that at least one memory cell is located above another memory cell. The at least one memory cell may include a charge trap layer.

U.S. Pat. Nos. 7,679,133, 8,553,466, 8,654,587, and 8,559,235, and U.S. Patent Application Publication No. 2011/0233648, the disclosures of which are incorporated herein by reference, disclose structures in which a 3D memory array includes a plurality of levels and word lines and/or bit lines are shared between the plurality of levels,.

The storage controller 110 may control the non-volatile memory 120 to write data to the non-volatile memory 120 in response to a write request received from the host 200. In the current example embodiment, the storage controller 110 may include a trace module 111.

The trace module 111 may trace the operation of each of, or at least some of, the internal components of the storage controller 110, transmission/reception signals of each internal component of the storage controller 110 or transmission/reception signals between the internal components of the storage controller 110 to generate trace data TD, and may provide the trace data TD to the non-volatile memory 120.

In an example embodiment, the trace module 111 may provide trace data TD having a raw data format listing trace records to the non-volatile memory 120. In another example embodiment, the trace module 111 may convert trace records into a file data format that is easy to analyze and may provide trace data TD in the file data format to the non-volatile memory 120. Accordingly, the non-volatile memory 120 may store trace data TD having the raw data or file data format.

In an example embodiment, the trace module 111 may generate trace data TD when a trigger condition occurs in the storage device 100 and provide the generated trace data TD to the non-volatile memory 120. For example, the trigger condition may occur when an operation error occurs in the storage device 100, when a specific (and/or alternatively predetermined) event or condition occurs in the storage device 100, or when a trigger control signal is received from the host 200. Alternatively or additionally, the trigger condition may occur when an error occurs on a protocol between the storage device 100 and the host 200 or when a specific (and/or alternatively predetermined) event occurs.

In an example embodiment, the trace module 111 may generate trace data TD before the trigger condition occurs, and the storage controller 110 may store at least some of the generated trace data TD in the non-volatile memory 120 when the trigger condition occurs.

In this way, the storage device 100 including the trace module 111 may generate trace data TD without involving an external device or store the trace data TD in the non-volatile memory 120, according to an event or condition occurring internally.

In some example embodiments, the storage device 100 may be an internal memory embedded in an electronic device. For example, the storage device 100 may be an embedded Universal Flash Storage (UFS) memory device, an embedded Multi-Media Card (eMMC), or a solid state drive (SSD). The storage device 100 may be mounted on the same substrate as the host 200. In some example embodiments, the storage device 100 may be an external memory detachably attached to an electronic device. For example, the storage device 100 may include at least one selected from a UFS memory card, a Compact Flash (CF) card, a Secure Digital (SD) card, a Micro-SD card, a Mini-SD card, an extreme Digital (xD) card, and a memory stick.

Figure 2:
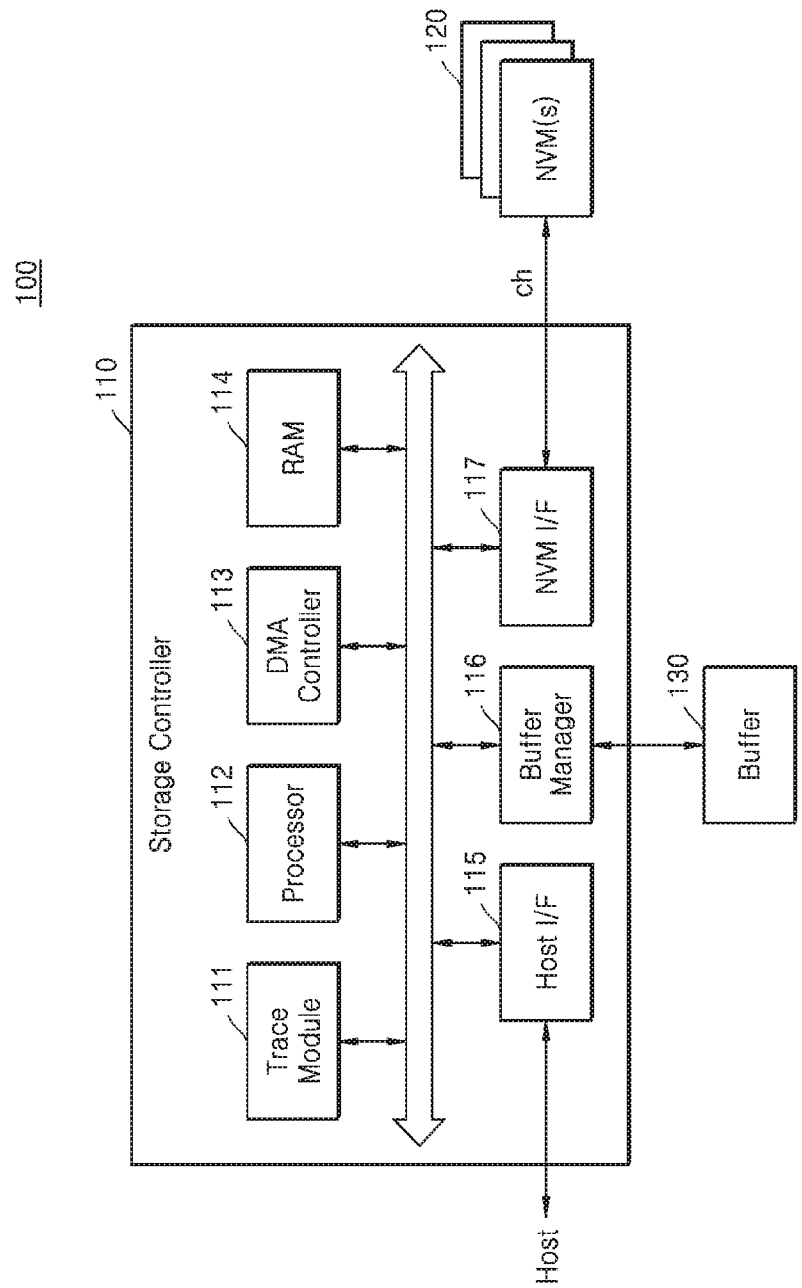
FIG. 2 is a block diagram of a storage device according to an example embodiment.

FIG. 2 is a block diagram of a storage device 100 according to an example embodiment.

Referring to FIG. 2, the storage device 100 may include a storage controller 110, a non-volatile memory 120, and/or a buffer 130. The storage controller 110 may include a trace module 111, a processor 112, a Direct Memory Access (DMA) controller 113, RAM 114, a host interface 115, a buffer manager 116, and a non-volatile memory interface 117, which are capable of communicating with each other via a bus 118. In addition, the storage device 100 may further include other peripheral devices such as an error checking and correction (ECC) engine.

The processor 112 may control all operations of the storage controller 110. The processor 112 may include a central processing unit, a microprocessor, or the like. The processor 112 may execute firmware to drive the storage controller 110. The firmware may be loaded in the RAM 114 and executed to drive the storage controller 110, and may include a flash translation layer (FTL). In an example embodiment, the firmware may include program code for controlling generation or storage of trace data.

The DMA controller 113 may support data transfer between the processor 112, the buffer 130, the non-volatile memory 120, the RAM 114 and the host interface 115, and may control the data transfer so that the data transfer is directly performed between the components without involving the processor 112.

The RAM 114 operates under the control of the processor 112 and may be used as a working memory, a buffer memory, a cache memory, and the like. Software for controlling the storage controller 110, that is, firmware, may be loaded in the RAM 114. The RAM 114 may be implemented with a volatile memory such as dynamic random access memory (DRAM) or static random access memory (SRAM). Alternatively or additionally, the RAM 114 may be implemented with a resistive memory such as RRAM, PRAM, or MRAM.

The host interface 115 may provide an interface between the host 200 and the storage controller 110. The host 200 and the storage controller 110 may be connected through at least one of various standard interfaces. The standard interfaces may include various interfaces such as Universal Serial Bus (USB), eMMC, Multi-Media Card (MMC), PCI express (PCI-E), AT Attachment (ATA), Serial AT Attachment (SATA), external SATA (e-SATA), Parallel AT Attachment (PATA), Small Computer System Interface (SCSI), Serial Attached SCSI (SAS), Enhanced Small Disk Interface (ESDI), Integrated Drive Electronics (IDE), IEEE 1394, and Card Interface.

The buffer manager 116 may provide an interface between the storage controller 110 and the buffer 130. Data to be stored in the non-volatile memory 120 or data to be read from the non-volatile memory 120 may be temporarily stored in the buffer 130 via the buffer manager 116.

The non-volatile memory interface 117 may provide an interface between the storage controller 110 and the non-volatile memory 120. For example, the storage controller 110 may transmit and/or receive data to and/or from the non-volatile memory 120 via the non-volatile memory interface 117.

The trace module 111 may generate trace data for other components of the storage controller 110, for example, the processor 112, the DMA controller 113, the RAM 114, the host interface 115, the buffer manager 116 and the non-volatile memory interface 117. Other components of the storage controller 110 may be referred to as intellectual property (IP). According to example embodiments of inventive concepts, an IP may include a semiconductor intellectual property core, including a reusable unit of logic, cell, or integrated circuit. The trace module 111 may generate trace data for each of, or at least some of, a plurality of IPs, or trace data for transmission/reception signals between IPs. The trace module 111 may also generate trace data for a protocol between the host 200 and the storage controller 110. As described above, the trace module 111 may trace the operation of each of, or at least some of, the plurality of IPs of the storage controller 110, transmission/reception signals of each of, or at least some of, the IPs, or transmission/reception signals between the IPs and generate trace data, and may output the trace data to the non-volatile memory 120.

In an example embodiment, the trace module 111 may trace a transmission signal and a reception signal between the host 200 and the host interface 115. In an example embodiment, the trace module 111 may trace the operation of the processor 112 or transmission/reception signals between the processor 112 and other IPs, and may also trace transmission/reception signals between the processor 112 and the buffer 130. In an example embodiment, the trace module 111 may trace transmission/reception signals between the DMA controller 113 and other IPs, and may also trace transmission/reception signals between the DMA controller 113 and the buffer 130. The trace module 111 may generate trace data according to a trace result and provide the trace data to the non-volatile memory 120.

The trace module 111 may generate trigger data or provide generated trigger data to the non-volatile memory device 120 when a trigger condition occurs, such as when an operation error of the storage device 100 occurs, when a specific (and/or alternatively predetermined) event or condition occurs in the storage device 100, when a trigger control signal is received from the host 200 or external device, or when an error occurs on a protocol between the storage device 100 and the host 200 or a specific (and/or alternatively predetermined) event occurs. For example, the case in which a trigger condition occurs may include a case in which an operational error occurs in each of, or at least some of, the processor 112, the DMA controller 113, the RAM 114, the host interface 115, the buffer manager 116, the non-volatile memory interface 117, the buffer 130, and the non-volatile memory 120. Also, the case in which a trigger condition occurs may include, for example, a case in which various operations are performed in the non-volatile memory 120 as a result of garbage collection and as the number of erase times of a memory block exceeds a threshold value, or a case in which a trigger control signal is received via a general purpose input/output (GPIO) of the storage device 100.

The trace module 111 may generate trace data in a raw data format or file data format and provide the trace data to the non-volatile memory 120.

An electronic device may include the trace module 111. The trace module 111 may be implemented with, or include, hardware, software, firmware, and/or a combination thereof. Although FIG. 2 shows that the trace module 111 transmits and receives signals to and from other IPs via the bus 118, the inventive concepts are not limited thereto and the trace module 111 may trace IPs or signals of the IPs via another bus or signal line.

In an example embodiment, the trace module 111 may generate trace data when a trigger condition occurs, and provide the generated trace data to the non-volatile memory 120.

In another example embodiment, the trace module 111 may generate trace data continuously before the occurrence of the trigger condition, and may temporarily store the generated trace data in the buffer 130. Accordingly, the trace data stored in the buffer 130 may be updated with newly generated trace data. When the trigger condition occurs, the storage controller 110 may store at least some of the trace data temporarily stored in the buffer 130 in the non-volatile memory 120.

The buffer 130 may temporarily store data to be stored in the non-volatile memory 120, or data to be read from the non-volatile memory 120. The buffer 130 may be implemented with DRAM, SRAM, PRAM, RRAM, or MRAM, or may be various combinations thereof; however, inventive concepts are not limited thereto. The buffer 130 may temporarily store trace data provided from the trace module 111 and transmit at least some of the stored trace data to the non-volatile memory 120 under the control of the storage controller 110.

The non-volatile memory 120 may store data or output stored data under the control of the storage controller 110. The non-volatile memory 120 may include a plurality of non-volatile memory chips including memory cell arrays, and may be coupled to the non-volatile memory interface 117 through a plurality of channels Ch. The non-volatile memory 120 may include a 3D memory cell array in which a memory cell string, to which memory cells are connected, is formed perpendicular to a substrate. However, the inventive concepts are not limited thereto, and the non-volatile memory 120 may include a planar-type memory cell array.

The non-volatile memory 120 may store user data provided from the host 200 or output stored user data. In addition, the non-volatile memory 120 may store trace data generated by the trace module 111, in accordance with an example embodiment.

As described above, the storage device 100 according to the example embodiment includes the trace module 111 in the storage controller 110, and the trace module 111 may generate trace data when a trigger condition occurs. Alternatively, trace data generated in the trace module 111 may be temporarily stored in the buffer 130, and then may be stored in the non-volatile memory 120 when a trigger condition is generated. In this manner, the storage device 100 may generate and store trace data without the involvement of an external device. Accordingly, acquiring trace data in an environment where it is difficult to connect an external device to the storage device 100 may become easier. Since trace data at the time of occurrence of an error or in a specific (and/or alternatively predetermined) situation may be stored in the non-volatile memory 120 and a user may use the stored trace data at a later time, the state of the storage device 100 in a specific (and/or alternatively predetermined) situation may be more easily analyzed without reproducing an operation error occurrence.

Figure 3:
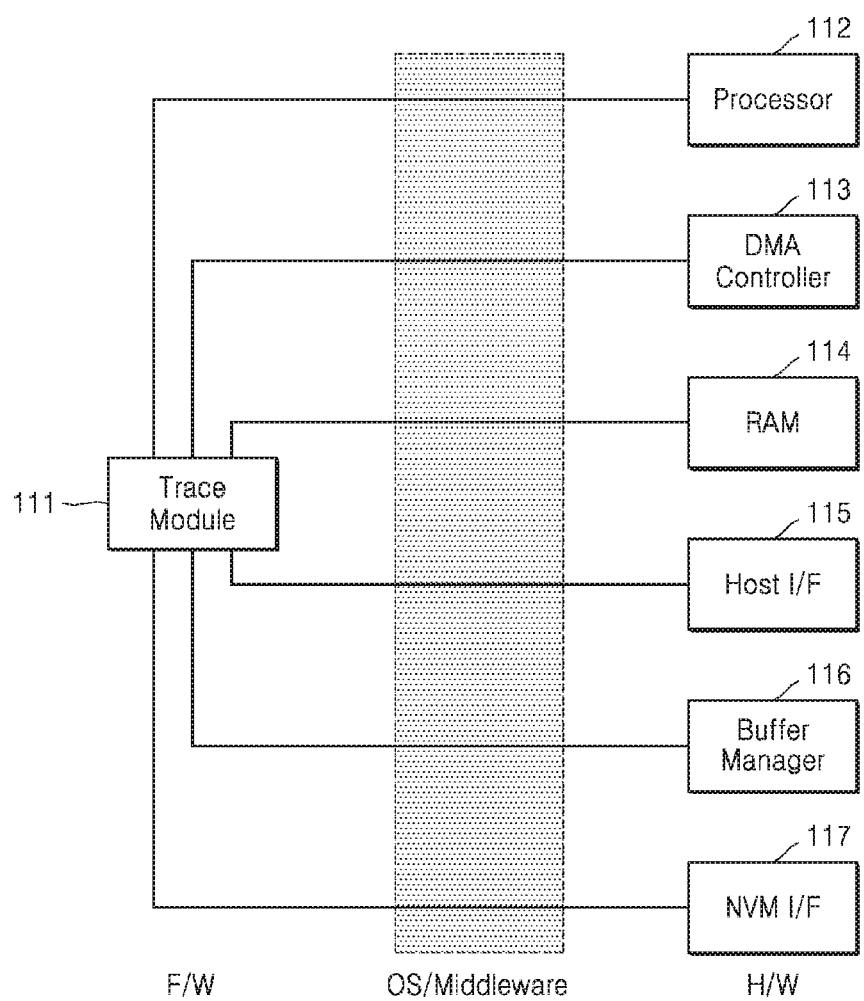
FIG. 3 is a block diagram illustrating a relationship between a trace module and other components, according to an example embodiment.

FIG. 3 is a block diagram illustrating a relationship between a trace module 111 and other components, according to an example embodiment.

Referring to FIG. 3, the trace module 111 may be implemented with firmware F/W or software. The trace module 111 may be implemented with program code, installed in RAM 114 or read only memory (ROM) (not shown) embedded in a storage controller, for example, the storage controller 110 of FIG. 2, and executed by a processor 112 when the storage device 100 is powered on. The trace module 111 may include machine readable program code for performing operations of generating and storing trace data.

The processor 112, a DMA controller 113, the RAM 114, a host interface 115, a buffer manager 116 and a non-volatile memory interface 117 may be implemented with hardware (H/W). An operating system (OS) and middleware may intervene between the trace module 111 and other components.

FIG. 3 shows an example in which the trace module 111 is implemented with firmware. However, the inventive concepts are not limited thereto, and the trace module 111 may be implemented with hardware or a combination of hardware and software.

Figure 4:
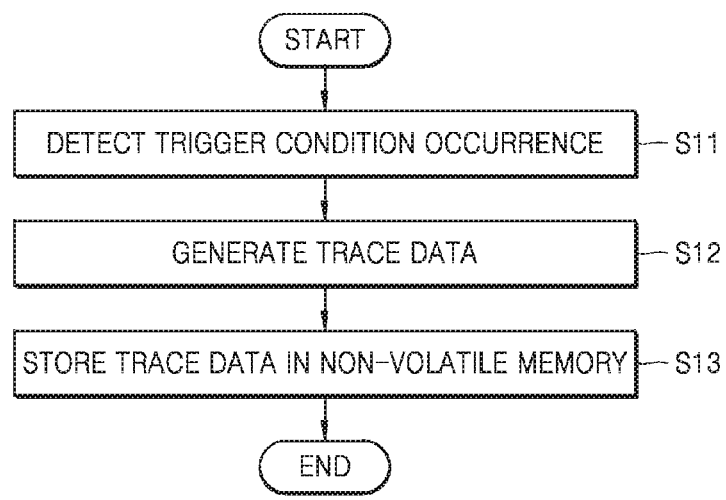
FIG. 4 is a flowchart of a trace data generation and storage method of a storage device, according to an example embodiment.

FIG. 4 is a flowchart of a trace data generation and storage method of a storage device, according to an example embodiment. The trace data generation and storage method of FIG. 4 may be performed in the storage device 100 described with reference to FIGS. 1 and 2. Accordingly, the description provided above with reference to FIGS. 1 and 2 may also be applied to the current example embodiment.

Referring to FIG. 4, in operation S11, the storage device 100 may detect that a trigger condition has occurred. For example, the processor 112 may detect that a trigger condition has occurred, based on an internal or external state of the storage device 100. For example, the processor 112 may detect that an operation error has occurred in the storage controller 110, the non-volatile memory 120, and/or the buffer 130. Alternatively, the processor 112 may detect that a trigger condition has occurred, based on signals generated in the storage device 100 or externally applied signals. In addition, the processor 112 may detect that a trigger condition has occurred when an error occurs in a protocol between the storage device 100 and the host 200, or a specific (and/or alternatively predetermined) event occurs.

In operation S12, the trace module 111 may generate trace data. When a trigger condition is generated in operation S11, the processor 112 may generate a trigger signal and the trace module 111 may generate trace data in response to the trigger signal. The trace module 111 may trace each of, or at least some of, the components of the storage controller 110 or transmission/reception signals of each of, or at least some of, the components and generate trace data as a result of the tracing. In an example embodiment, the trace module 111 may perform a trace operation during a specific (and/or alternatively predetermined) time interval in response to a trigger signal.

In operation S13, the trace data is stored in the non-volatile memory 120. The trace data generated by the trace module 111 may be temporarily stored in a buffer inside or outside the storage controller 110, for example, in the buffer 130, and then be transmitted to the non-volatile memory 120. The non-volatile memory 120 may write trace data to a memory cell array in page units and may store the trace data.

Figure 5:
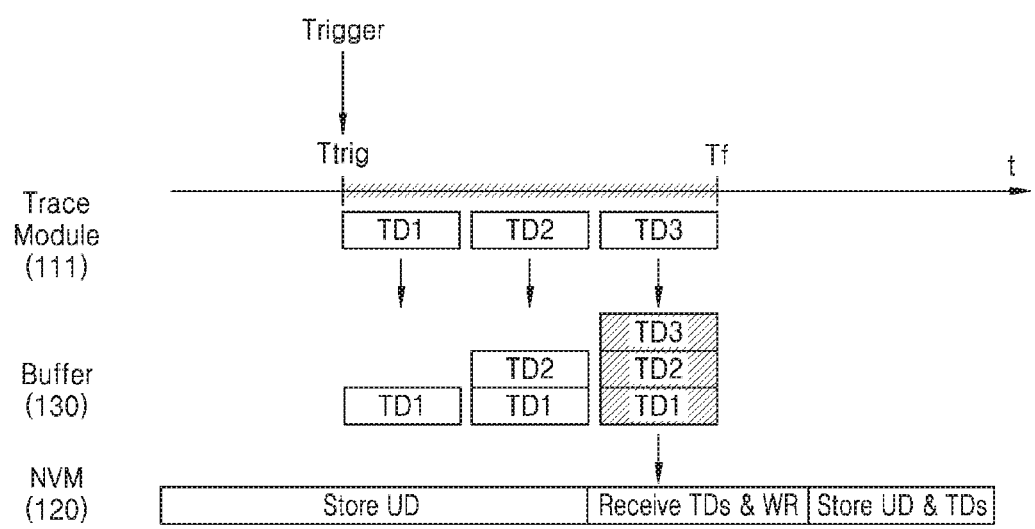
FIG. 5 is a detailed diagram illustrating a trace data generation and storage method of a storage device, according to an example embodiment.

FIG. 5 is a detailed diagram illustrating a trace data generation and storage method of a storage device, according to an example embodiment. FIG. 5 shows the trace data generation and storage of the storage device 100 according to time.

Referring to FIG. 5, the non-volatile memory 120 may store user data UD during the operation of the storage device 100. The non-volatile memory 120 may store received user data UD or read stored user data UD.

When a trigger condition occurs at a trigger point Ttrig, the trace module 111 may generate trace data TDs. The trace module 111 may generate trace data TDs continuously after the trigger point Ttrig. For example, the trace module 111 may generate first through third trace data TD1, TD2, and TD3 during a specific (and/or alternatively predetermined) time interval, e.g., an interval from the trigger point Ttrig to point Tf. The terms 'first', 'second' and 'third' are used only to identify the order in which trace data is generated and transmitted, and do not identify a type of trace data, for example, whether the trace data is trace data for one IP or another.

The generated trace data TD1, TD2, and TD3 may be temporarily stored in the buffer 130 in order. Although the current example embodiment of FIG. 5 shows a case in which the trace data TD1, TD2, and TD3 are stored in an external buffer 130 (e.g., DRAM) of the storage controller 110, the inventive concepts are not limited thereto. For example, the trace data TD1, TD2, and TD3 may be stored in a buffer arranged in the storage controller 110. When the data size of the trace data TD1, TD2, and TD3 stored in the buffer 130 corresponds to the unit of transmission of the non-volatile memory 120, the trace data TD1, TD2, and TD3 may be transmitted to the non-volatile memory 120. For example, the trace data TD1, TD2, and TD3 may be output from the buffer 130 under the control of the processor 112 or the DMA controller 113 and then be transmitted to the non-volatile memory 120. The non-volatile memory 120 may receive the trace data TD1, TD2, and TD3 and write them to a memory cell array. Accordingly, the non-volatile memory 120 may store user data UD and trace data TDs. The trace data TDs stored in the non-volatile memory 120 may be read and transmitted depending on a request of a host.

Figure 6:
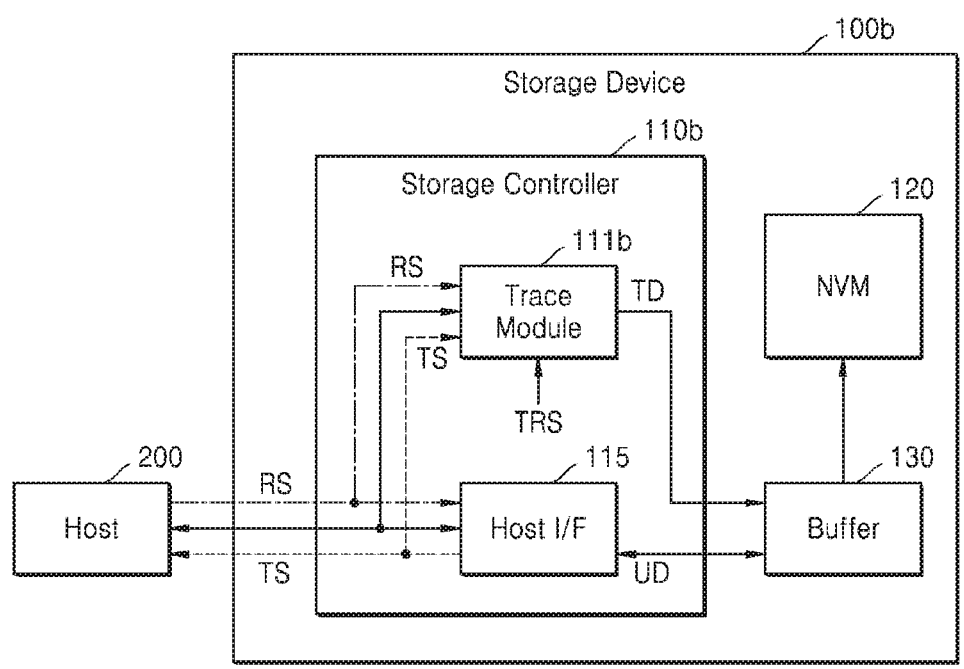
FIG. 6 is a block diagram for explaining a trace data generation and storage method of a storage device, according to an example embodiment.

FIG. 6 is a block diagram for explaining a trace data generation and storage method of a storage device 100b, according to an example embodiment. As an example, FIG. 6 illustrates the operation of the storage device 100b according to the trace data generation and storage method described with reference to FIGS. 4 and 5, and more particularly, illustrates an operation in which the storage device 100b generates protocol trace data between a host 200 and a host interface 115. The description provided above with reference to FIGS. 4 and 5 may be applied to the current example embodiment.

Referring to FIG. 6, the host 200 and the host interface 115 may communicate with one another according to a specific (and/or alternatively predetermined) protocol. The host interface 115 may receive data, e.g., user data UD, and a control signal from the host 200. The host interface 115 may transmit data and an acknowledgment signal to the host 200. The host interface 115 may transmit the received user data UD to a non-volatile memory 120 via a buffer 130, and may receive, via the buffer 130, user data UD read from the non-volatile memory 120 and transmit it to the host 200. The transmission of data may be controlled by the processor 112 or the DMA controller 113 of FIG. 2.

A trace module 111b may operate in response to a trigger signal TRS. The trigger signal TRS may be generated when a trigger condition occurs. For example, as described with reference to FIG. 4, the processor 112 may detect trigger condition occurrence and generate the trigger signal TRS.

The trace module 111b may receive a transmission signal TS and a reception signal RS of the host interface 115. For example, the trace module 111b may trace (or monitor) transmission/reception signals between the host interface 115 and the host 200. In an example embodiment, the trace module 111b may trace transmission/reception signals for a specific (and/or alternatively predetermined) time interval. The trace module 111b may generate trace data TD, for example, protocol trace data for a protocol between the host interface 115 and the host 200.

The trace module 111b may provide the trace data TD to the non-volatile memory 120 via the buffer 130. The buffer 130 may temporarily store the trace data TD and then provide the non-volatile memory 120 with the trace data TD. Thereby, when a trigger condition occurs, the storage device 100b may generate the trace data TD and store the trace data TD in the non-volatile memory 120.

Figure 7:
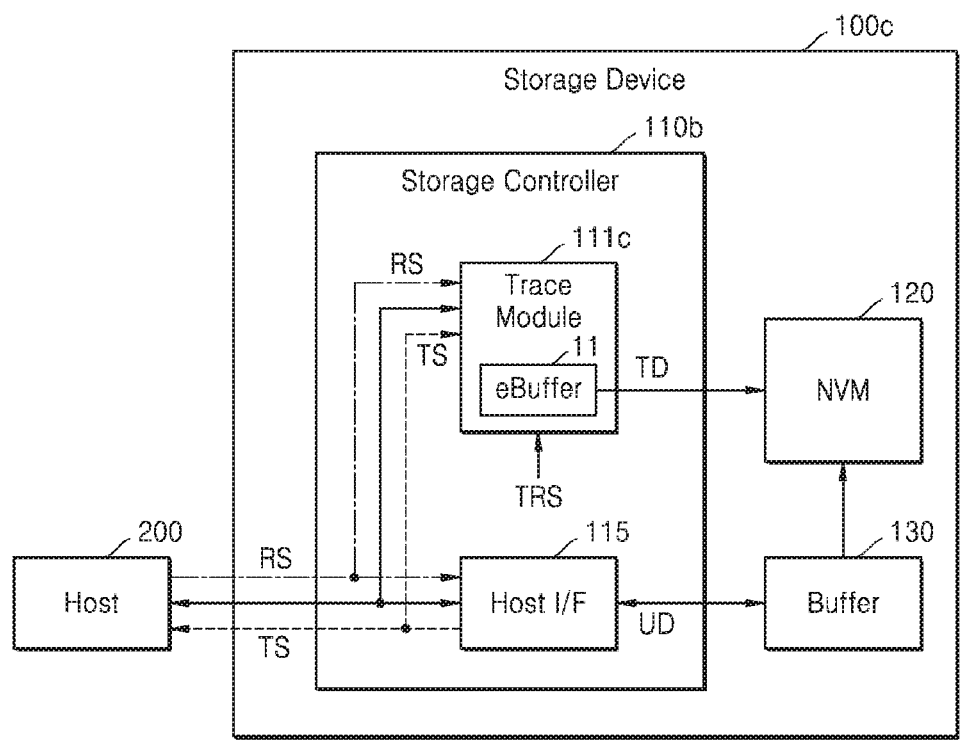
FIG. 7 is a block diagram for explaining a trace data generation and storage method of a storage device, according to an example embodiment.

FIG. 7 is a block diagram for explaining a trace data generation and storage method of a storage device 100c, according to an example embodiment.

An operation method of the storage device 100c of FIG. 7, that is, the trace data generation and storage method of the storage device 100c, is similar to that of the storage device 100b of FIG. 6. However, in FIG. 7, a trace module 111c may include an embedded buffer 11. For example, the embedded buffer 11 may be implemented with DRAM, SRAM, RRAM, PRAM, MRAM, or the like; however, inventive concepts are not limited thereto. The capacity of the embedded buffer 11 may be less than that of a buffer 130. The trace module 111c may generate trace data TD in response to a trigger signal TRS and temporarily store the generated trace data TD in the embedded buffer 11. The trace module 111c may directly transmit the trace data TD to the non-volatile memory device 120.

Figure 8:
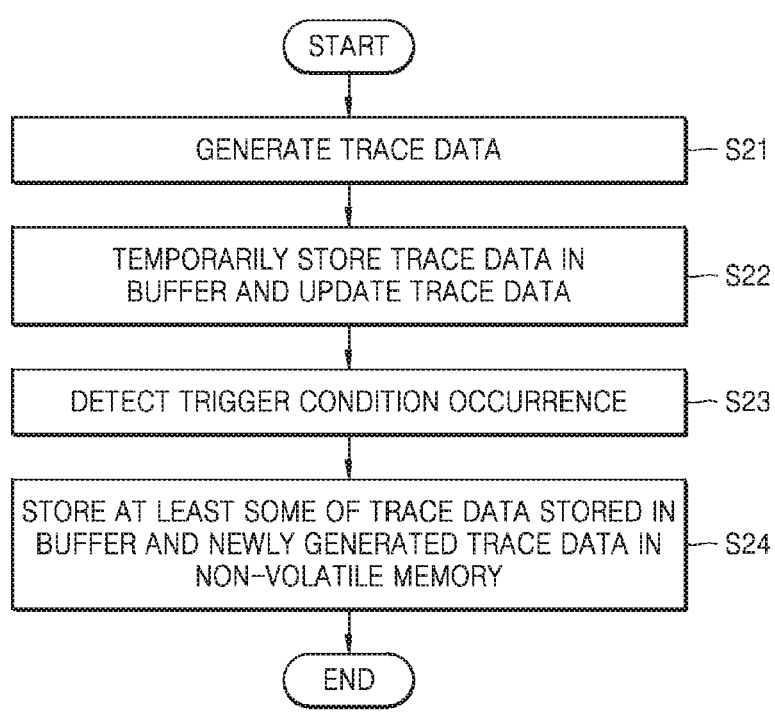
FIG. 8 is a flowchart of a trace data generation and storage method of a storage device, according to an example embodiment.

FIG. 8 is a flowchart of a trace data generation and storage method of a storage device, according to an example embodiment. The trace data generation and storage method of FIG. 8 may be performed in the storage device 100 described with reference to FIGS. 1 and 2. Accordingly, the description provided above with reference to FIGS. 1 and 2 may also be applied to the current example embodiment.

Referring to FIG. 8, in operation S21, the trace module 111 may generate trace data. In an example embodiment, the trace module 111 may always generate trace data when the storage device 100 operates. In another example embodiment, the trace module 111 may continuously generate trace data in response to a request from the host 200 or an external signal.

In operation S22, the trace data may be temporarily stored in the buffer 130 and be updated. The storage controller 110 may transmit the trace data to the buffer 130. The trace data may be temporarily stored in the buffer 130, and old data of a plurality of pieces of trace data stored in the buffer 130 may be replaced with trace data newly received by the buffer 130. In other words, the size of an area in which the trace data is stored in the buffer 130 may be limited, and when trace data exceeding an area having a limited size is received, the area may be updated based on newly received trace data.

In operation S23, the storage device 100 may detect that a trigger condition has occurred. For example, the processor 112 may detect that a trigger condition has occurred based on an internal or external state of the storage device 100.

When a trigger condition occurs, in operation S24, the storage device 100 may store at least some of trace data stored in the buffer 130 and newly generated trace data in the non-volatile memory 120. In other words, among a plurality of pieces of trace data continuously generated by the trace module 111, some trace data generated before and after trigger condition occurrence may be stored in the non-volatile memory 120.

Figure 9:
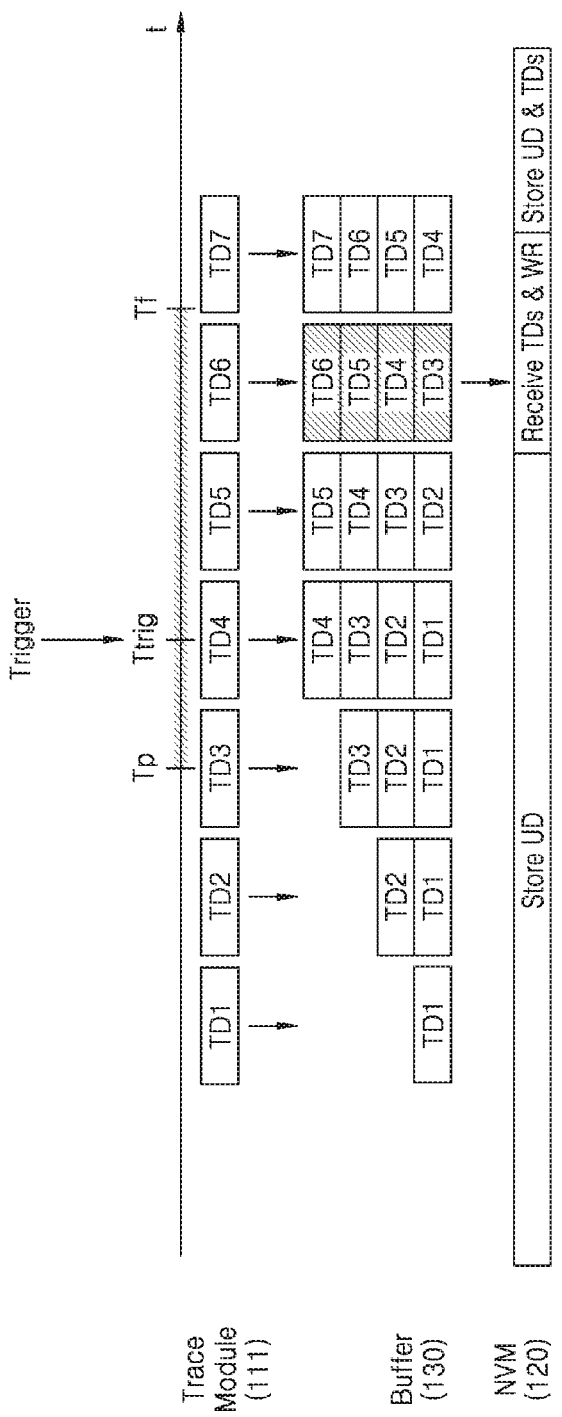
FIG. 9 is a detailed diagram illustrating a trace data generation and storage method of a storage device, according to an example embodiment.

FIG. 9 is a detailed diagram illustrating a trace data generation and storage method of a storage device, according to an example embodiment. FIG. 9 shows the trace data generation and storage of the storage device 100 according to time.

Referring to FIG. 9, when the storage device 100 operates, the trace module 111 may generate trigger data. Thus, a plurality of pieces of trigger data TDs, for example, first to seventh trigger data TD1 to TD7, may be generated. The plurality of pieces of trigger data TDs may be temporarily stored in the buffer 130 according to the order in which they are generated. In this case, when the size of trace data received by the buffer 130 exceeds the capacity of the buffer 130 or the capacity set to store the trace data in the buffer 130, the trace module 111 may delete trace data stored previously, as shown in FIG. 9, and newly received trace data may be stored in the buffer 130. Thus, the buffer 130 may be updated based on the newly received trace data.

When a trigger condition occurs at a trigger point Ttrig, trace data generated before and after the trigger point Ttrig may be stored in the non-volatile memory 120. For example, trace data (e.g., third to sixth trace data TD3 to TD6) generated during a first period before the trigger point Ttrig, for example, a period from the trigger point Ttrig to a point Tp, and a second period after the trigger point Ttrig, for example, a period from the trigger point Ttrig to a point Tf, may be transmitted to the non-volatile memory 120. The lengths of the first and second periods may be set in advance; however, inventive concepts are not limited thereto. In an example embodiment, the length of the second period may be greater than the length of the first period. The third trace data TD3 stored in the buffer 130 at the trigger point Ttrig and the fourth to sixth trace data TD4 to TD6 generated by the trace module 111 after the trigger point Ttrig may be transmitted from the buffer 130 to the non-volatile memory 120.

The non-volatile memory 120 may receive the third to sixth trace data TD3 to TD6 and write them to a memory cell array. Accordingly, the non-volatile memory 120 may store user data UD and trace data TDs.

Figure 10:
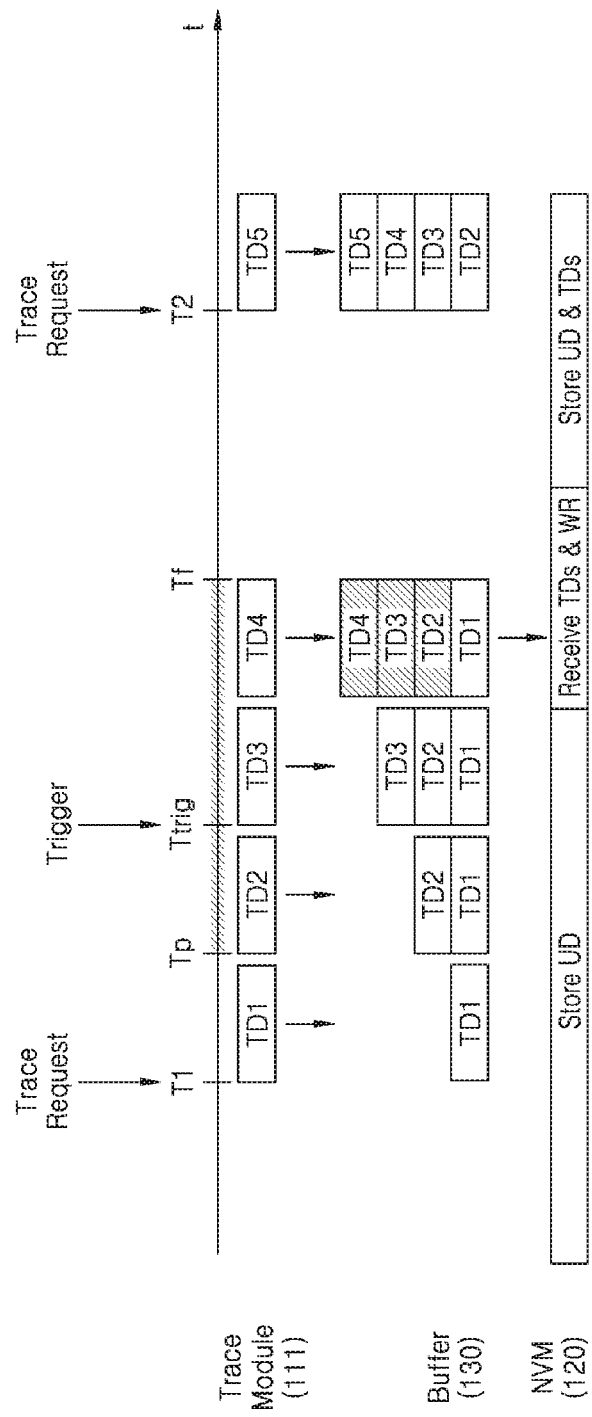
FIG. 10 is a detailed diagram illustrating a trace data generation and storage method of a storage device, according to an example embodiment.

FIG. 10 is a detailed diagram illustrating a trace data generation and storage method of a storage device, according to an example embodiment. FIG. 10 shows the trace data generation and storage of the storage device 100 in FIGS. 1 and 2 according to time.

Referring to FIG. 10, the trace module 111 may generate trigger data according to a trace request. For example, a trace request may be received from the host 200, or may be received from an external device via input/output pins of the storage device 100. For example, a user may request a trace operation from the storage device 100 through the host 200, or an external device.

When a trace request is received at a point T1, the trace module 111 may perform a trace operation and continuously generate a plurality of pieces of trace data TDs, for example, first to fourth trace data TD1 to TD4. The plurality of pieces of trigger data TDs may be temporarily stored in the buffer 130 according to the order in which they are generated.

Thereafter, when a trigger condition occurs at a trigger point Ttrig, trace data generated before and after the trigger point Ttrig may be stored in the non-volatile memory 120. For example, trace data (e.g., second to fourth trace data TD2 to TD4) generated during a first period before the trigger point Ttrig, for example, a period from the trigger point Ttrig to a point Tp, and a second period after the trigger point Ttrig, for example, a period from the trigger point Ttrig to a point Tf, may be transmitted from the buffer 130 to the non-volatile memory 120. The non-volatile memory 120 may receive the second to fourth trace data TD2 to TD4 and write them to a memory cell array.

Thereafter, the trace module 111 may generate trace data when a trace request is received again, and the generated trace data, for example, fifth trace data TD5, may be temporarily stored in the buffer 130.

Although FIG. 10 shows a case in which the trace module 111 stops the operation thereof after generating trace data up to the point Tf and then generates trace data when a trace request is received again, the inventive concepts are not limited thereto. The trace module 111 may continue to generate trace data even after the point Tf.

Figure 11:
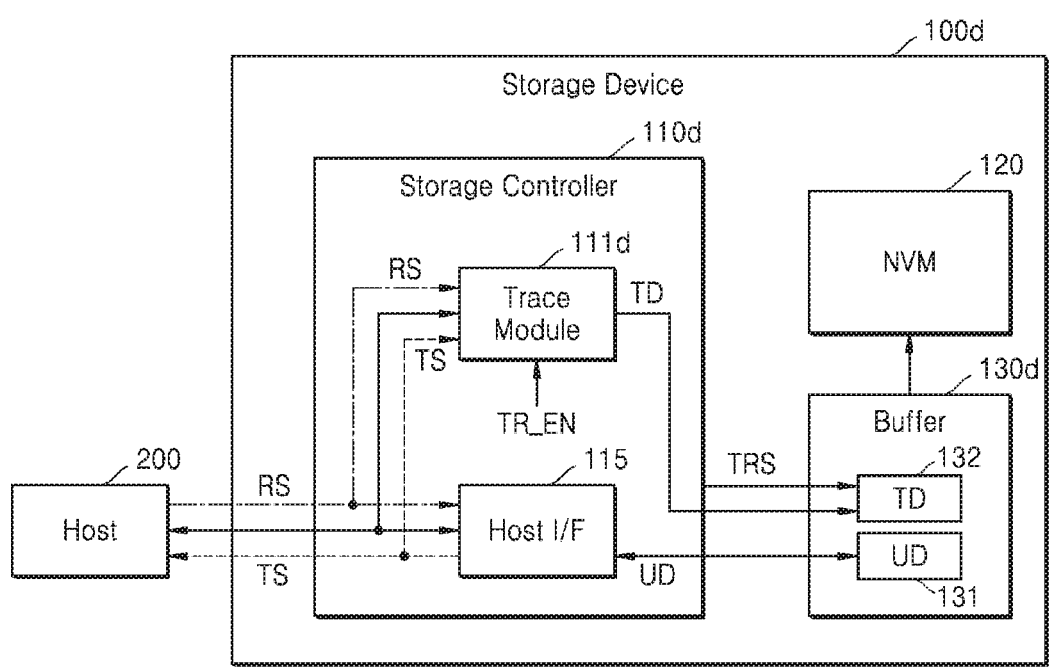
FIG. 11 is a block diagram for explaining a trace data generation and storage method of a storage device, according to an example embodiment.

FIG. 11 is a block diagram for explaining a trace data generation and storage method of a storage device 100d, according to an example embodiment. As an example, FIG. 11 illustrates the operation of the storage device 100d according to the trace data generation and storage method described with reference to FIGS. 8 to 10, and more particularly, illustrates an operation in which the storage device 100d generates protocol trace data between a host 200 and a host interface 115. The description provided above with reference to FIGS. 8 to 10 may be applied to the current example embodiment.

Referring to FIG. 11, a trace module 111d may generate trace data TD. For example, the trace module 111d may trace (or monitor) transmission/reception signals between the host interface 115 and the host 200, and may generate, as the trace data TD, protocol trace data for a protocol between the host interface 115 and the host 200.

In an example embodiment, as described with reference to FIG. 8, the trace module 111d may always generate trace data TD when the storage device 100d operates. For example, the trace module 111d may operate in response to a trace enable signal TR_EN, and the trace enable signal TR_EN may remain active when the storage device 100d is in operation.

In another example embodiment, as described with reference to FIG. 9, the trace module 111d may generate trace data TD when a trace request is received by the storage device 100d. For example, when a trace request is received, the processor 112 may generate the trace enable signal TR_EN. The generation of the trace enable signal TR_EN may indicate that the trace enable signal TR_EN is in an activated state. The trace module 111d may operate in response to the trace enable signal TR_EN.

The generated trace data TD may be transmitted to a buffer 130d. The buffer 130d may temporarily store the trace data TD. The buffer 130d may include a first area 131 for temporarily storing user data UD provided from the host 200 or read from the non-volatile memory 120 and a second area 132 for storing the trace data TD. As described with reference to FIG. 9, when there is insufficient storage space in the second area 132 of the buffer 130d, the trace module 111 may delete old trace data and may store newly received trace data.

When a trigger condition occurs, the buffer 130d may transmit some of a plurality of pieces of stored trace data or some of a plurality of pieces of newly stored trigger data to the non-volatile memory 120.

In an example embodiment, when a trigger condition occurs, the storage controller 110d may generate a trigger signal TRS and provide the trigger signal TRS to the buffer 130d, as shown in FIG. 10. In response to the trigger signal TRS, the buffer 130d may transmit some of a plurality of pieces of trace data stored before the trigger signal TRS is applied to the buffer 130d and some of a plurality of pieces of trace data stored after the trigger signal TRS is applied to the buffer 130d to the non-volatile memory 120.

Thus, the storage device 100d may generate trace data TD before a trigger condition occurs, and may store trace data TD, generated in some periods before and after the occurrence of the trigger condition, in the non-volatile memory 120 when the trigger condition occurs.

Figure 12:
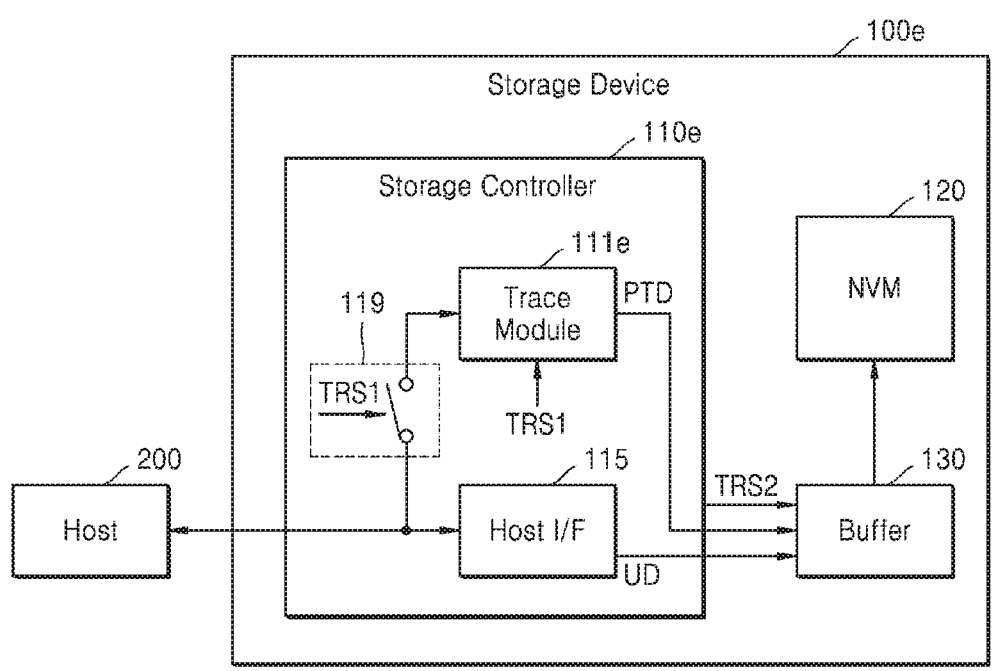
FIG. 12 is a block diagram of a storage device according to an example embodiment.

FIG. 12 is a block diagram of a storage device 100e according to an example embodiment.

Referring to FIG. 12, the storage device 100e may include a storage controller 110e, a buffer 130, and a non-volatile memory 120. The storage controller 110e may include a trace module 111e, a host interface 115, and a switching unit 119. The storage controller 110e further includes other components that are the same as, or similar to, those shown in FIG. 2. However, descriptions of other components will be omitted for convenience of explanation.

The switching unit 119 may be turned on in response to a first trigger signal TRS1 and the trace module 111e may operate in response to the first trigger signal TRS1. The buffer 130 may transmit at least some of pieces of stored trace data to the non-volatile memory 120 in response to a second trigger signal TRS2. Thus, the storage device 100e may operate according to the trace data generation and storage method of FIG. 4 or 8.

For example, the storage controller 110e may detect the occurrence of a trigger condition and generate the first trigger signal TRS1 and the second trigger signal TRS2. Since the switching unit 119 is turned on in response to the first trigger signal TRS1, transmission/reception signals of the host interface 115 may be transmitted to the trace module 111e. The trace module 111e may trace the transmission/reception signals of the host interface 115 to generate trace data TD. The trace data TD may be temporarily stored in the buffer 130. The buffer 130 may send the stored trace data TD to the non-volatile memory 120, in response to the second trigger signal TRS2. Accordingly, when a trigger condition occurs, the storage device 100e may generate trace data TD and store the trace data TD in the non-volatile memory 120.

As another example, when the storage device 100e operates, the storage controller 110e may generate the first trigger signal TRS1 all the time or according to a trace request from the outside, and then may generate the second trigger signal TRS2 when a trigger condition occurs. In other words, the storage controller may generate the second trigger signal TRS2 after the first trigger signal TRS1 is generated.

When the first trigger signal TRS1 is generated, the switching unit 119 may be turned on in response to the first trigger signal TRS1 and the trace module 111e may operate. The transmission/reception signals of the host interface 115 may be transmitted to the trace module 111e, and the trace module 111e may trace the transmission/reception signals of the host interface 115 to generate the trace data TD. After the first trigger signal TRS1 is generated, the trace module 111e may continue to generate the trace data TD. The generated trace data TD may be temporarily stored in the buffer 130. Some old data of a plurality of pieces of trace data temporarily stored in the buffer 130 may be deleted, or erased, or written over.

When a trigger condition occurs, the storage controller 110e may generate the second trigger signal TRS2. The buffer 130 may transmit at least some of a plurality of pieces of trace data stored in the buffer 130 to the non-volatile memory 120 in response to the second trigger signal TRS2. The buffer 130 may transmit trace data stored in a specific (and/or alternatively predetermined)desired time period before and after the generation of the second trigger signal TRS2 to the non-volatile memory 120. Accordingly, the storage device 100e may generate trace data TD before a trigger condition occurs, and may store the trace data TD in the non-volatile memory 120 when a trigger condition occurs.

Although FIG. 12 shows a case in which the trace module 111e traces a protocol between the host interface 115 and the host 200 and generates protocol trace data PTD according to a result of the tracing, the case is for convenience of explanation and the inventive concepts are not limited thereto. As described above with reference to FIG. 2, the storage device 100e may trace the operation of each of, or at least some of, the other components in the storage controller 110e or transmission/reception signals between components, and may generate various kinds of trace data.

Figure 13A:
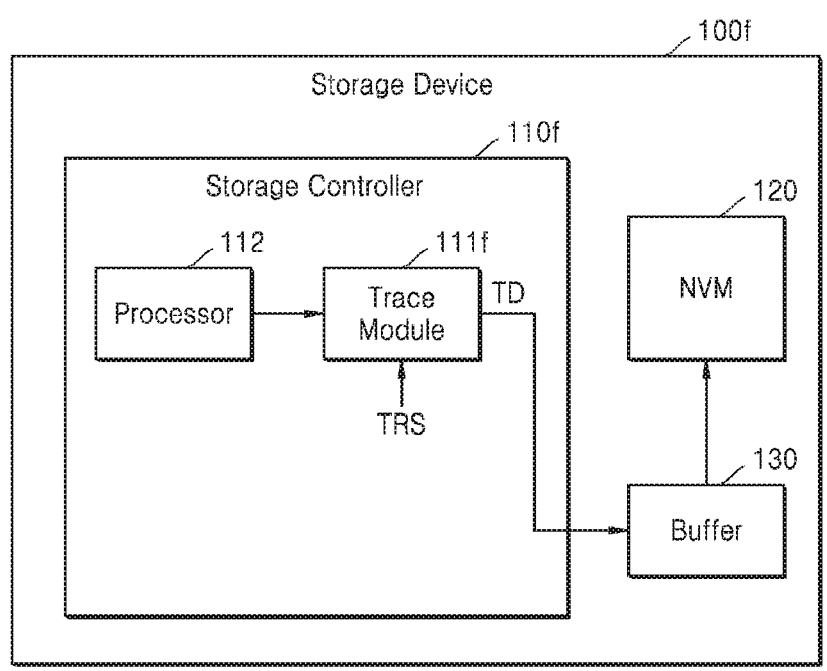
FIGS. 13A and 13B are block diagrams for explaining trace data generation and storage methods of storage devices, according to example embodiments.
Figure 13B:
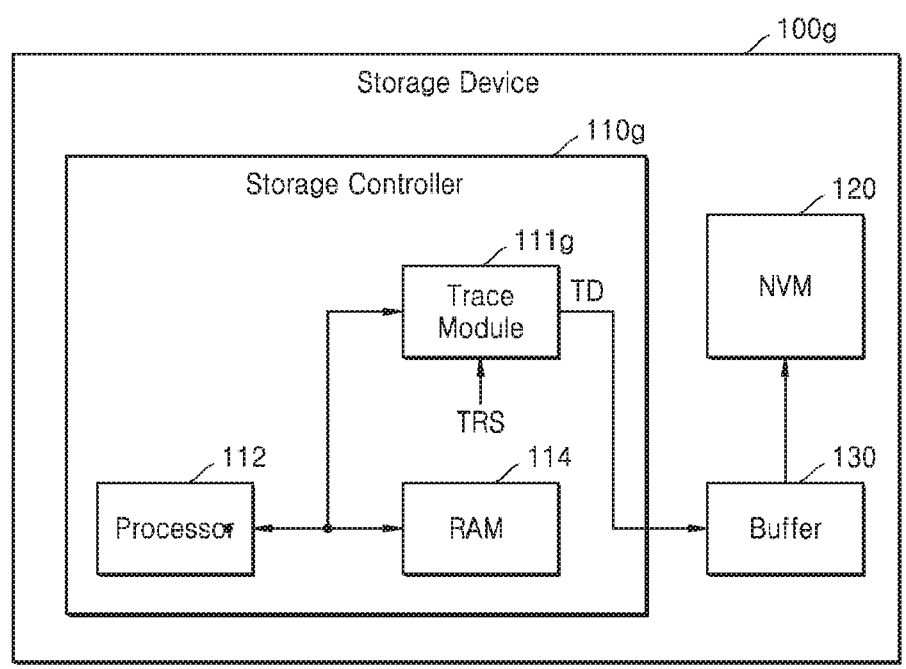

FIGS. 13A and 13B are block diagrams for explaining trace data generation and storage methods of storage devices 100f and 100g, according to example embodiments.

FIGS. 13A and 13B illustrate that the storage devices 100f and 100g generate processor trace data. The trace data generation and storage method according to any one of various example embodiments described above may be applied to the current example embodiments.

Referring to FIG. 13A, a trace module 111f may monitor the operation of a processor 112. For example, the trace module 111f may trace commands, operations, and/or the like performed by the processor 112, and generate trace data.

Referring to FIG. 13B, a trace module 111g may monitor transmission/receptions signals between the processor 112 and other components, such as RAM 114 shown in FIG. 13B. The trace module 111g may trace transmission/reception signals between the processor 112 and the RAM 124 and generate trace data.

As described with reference to FIGS. 13A and 13B, trace data generated as the trace modules 111f and 111g trace the operation of the processor 112 or transmission/reception signals between the processor 112 and other components may be referred to as processor trace data.

As described above, storage controllers 110f and 110g may generate trace data TD when a trigger condition occurs. For example, the storage controllers 110f and 110g may generate trace data TD in response to a trigger signal TRS, temporarily store the generated trace data TD in a buffer 130, and then store the generated trace data TD in a non-volatile memory 120. Alternatively or additionally, the storage controllers 110f and 110g may generate trace data TD and temporarily store the generated trace data TD in the buffer 130, and then store trace data TD, generated in some periods before and after the occurrence of a trigger condition, in the non-volatile memory 120 when the trigger condition occurs.

Figure 14:
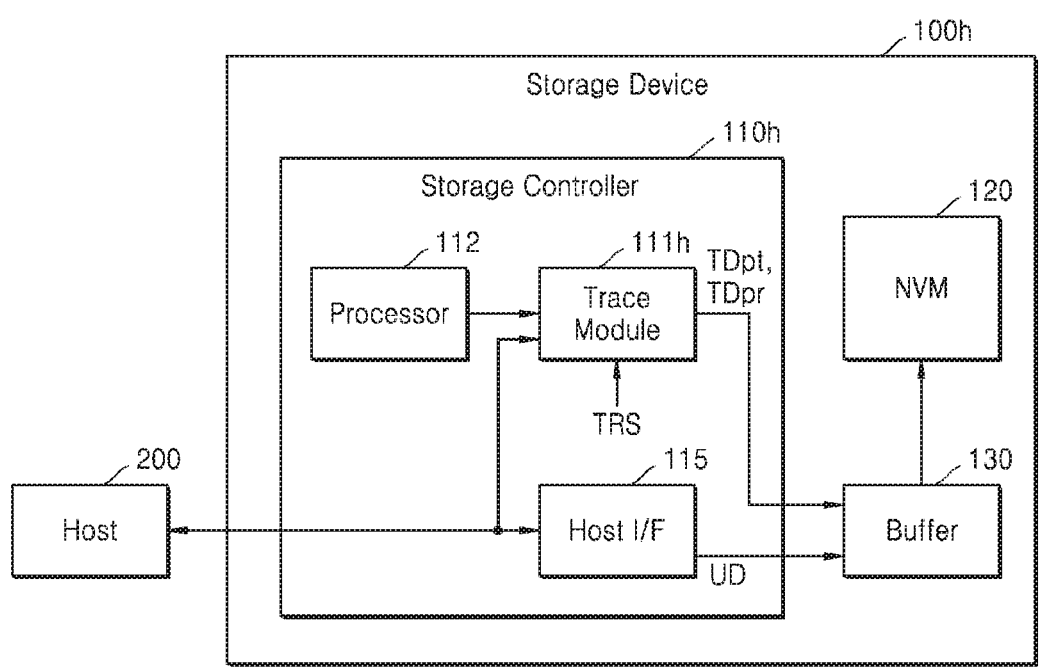
FIG. 14 is a block diagram for explaining a trace data generation and storage method of a storage device, according to an example embodiment.

FIG. 14 is a block diagram for explaining a trace data generation and storage method of a storage device 100h, according to an example embodiment.

FIG. 14 illustrates that the storage device 100h generates processor trace data and protocol trace data. The trace data generation and storage method according to any one of various example embodiments described above may be applied to the current example embodiment.

Referring to FIG. 14, a trace module 111h may monitor the operation of a processor 112 and also monitor transmission/reception signals between a host 200 and a host interface 115. Accordingly, the trace module 111 may generate protocol trace data TDpt and processor trace data TDpr. Although not shown, the trace module 111h may operate in response to at least one trigger signal (or trace enable signal).

In an example embodiment, the trace module 111*h* may simultaneously, or contemporaneously, generate the processor trace data TDpr and the protocol trace data TDpt. In an example embodiment, the trace module 111*h* may generate the processor trace data TDpr and the protocol trace data TDpt at different points in time. The trace module 111*h* may generate the protocol trace data TDpt when a trigger condition related to a protocol, for example, an error in the protocol, occurs or a specific (and/or alternatively predetermined) event occurs, and may generate the processor trace data TDpr when a trigger condition related to the processor 112, for example, an operation error of the storage controller 110*h*, occurs or a specific (and/or alternatively predetermined) event or condition occurs. A buffer 130 may temporarily store the generated protocol trace data TDpt or the generated processor trace data TDpr, and then at least some thereof may be stored in a non-volatile memory 120. Alternatively, the generated protocol trace data TDpt or the generated processor trace data TDpr may be directly transmitted to and stored in the non-volatile memory 120 without proceeding through the buffer 130.

Figure 15:
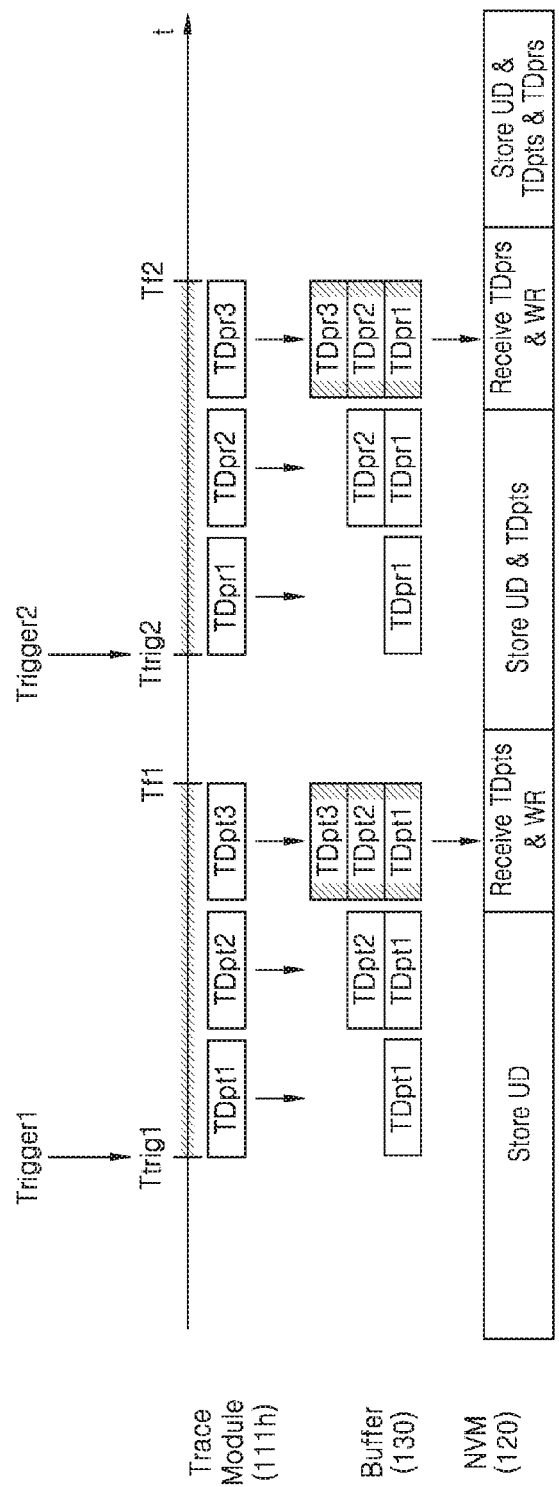
FIG. 15 is a detailed diagram illustrating an example of a trace data generation and storage method of the storage device of FIG. 14.

FIG. 15 is a detailed diagram illustrating an example of a trace data generation and storage method of the storage device 100*h* of FIG. 14.

Referring to FIG. 15, a first trigger condition may occur at a point Ttrig1. The first trigger condition may be a trigger condition related to a protocol. Accordingly, the trace module 111*h* may generate protocol trace data TDpts, for example, first to third protocol trace data TDpt1 to TDpt3. The generated protocol trace data TDpts may be transmitted to the non-volatile memory 120 via the buffer 130. The non-volatile memory 120 may store the received protocol trace data TDpts by writing the received protocol trace data TDpts into a memory cell array.

Thereafter, a second trigger condition may occur at a point Ttrig2. The second trigger condition may be a trigger condition related to the processor 112. The trace module 111*h* may generate processor trace data TDprs, for example, first to third processor trace data TDpr1 to TDpr3. The generated processor trace data TDprs may be transmitted to the non-volatile memory 120 via the buffer 130. The non-volatile memory 120 may store the received processor trace data TDpes by writing the received processor trace data (TDpes) into a memory cell array.

Although FIG. 15 shows a case in which trace data is generated when a trigger condition occurs, the inventive concepts are not limited thereto. As described with reference to FIG. 8, the trace module 111*h* may generate trace data before a trigger condition occurs. The storage controller 110*h* may temporarily store continuously generated trace data in the buffer 130, and then at least some of trace data stored in the buffer 130, that is, trace data generated in some periods before and after the occurrence of a trigger condition, may be stored in the non-volatile memory 120 when the trigger condition occurs.

Although FIG. 15 shows a case in which the processor trace data TDprs and the protocol trace data TDpts are generated at different points in time, the inventive concepts are not limited thereto. For example, the trace module 111*h* may generate the processor trace data TDprs and the protocol trace data TDpts at the same time. In addition, the trace data TDprs and the protocol trace data TDpts may be stored in the non-volatile memory 120 at the same time.

The trace data generation and storage methods according to various example embodiments have been described above with reference to FIGS. 4 to 15. A method of generating and storing protocol trace data and processor trace data has been described above as an example. However, the inventive concepts are not limited thereto, and as described above with reference to FIG. 2, a trace module may generate various kinds of trace data related to components of a storage controller. A method of generating such various kinds of trace data may be derived based on the trace data generation method described above, and may be obvious to one of ordinary skill in the art.

Figure 16:
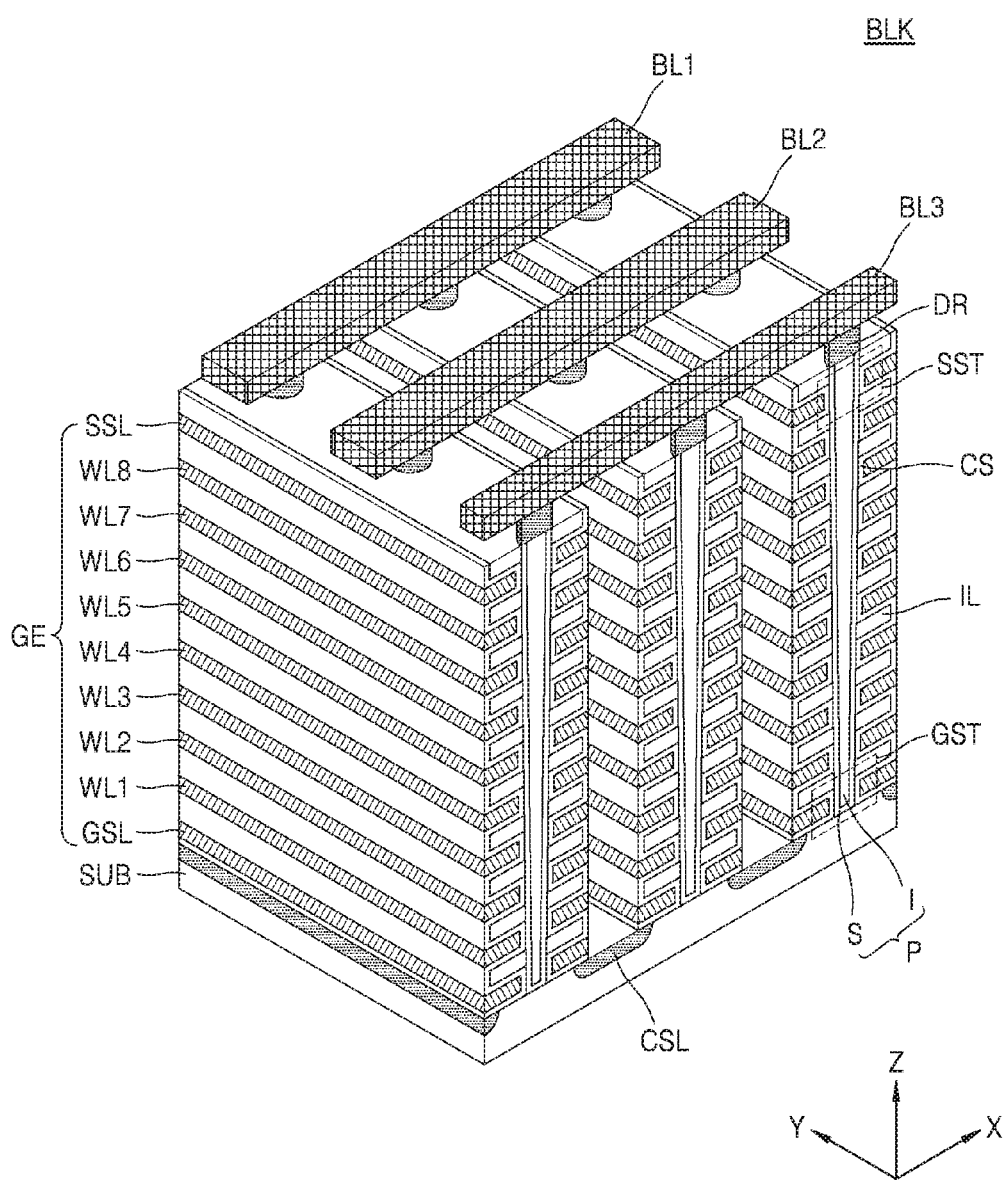
FIG. 16 is a structural diagram illustrating an example of implementation of a non-volatile memory of FIG. 1.

FIG. 16 is a structural diagram illustrating an example of implementation of the non-volatile memory 120 of FIG. 1. FIG. 16 shows an example in which the non-volatile memory 120 includes one or more flash cell blocks and the flash cell blocks are implemented in a 3D form.

Referring to FIG. 16, a cell block BLK may be provided in a vertical direction to a substrate SUB. Although FIG. 16 illustrates an example in which the cell block BLK includes two selection lines GSL and SSL, eight word lines WL1 to WL8, and three bit lines BL1 to BL3, the cell block BLK may actually include more or fewer selection lines, word lines, and bit lines than those described above.

The substrate SUB may have a first conductivity type (e.g., a p-type). A common source line CSL may be provided on the substrate SUB and extend in a first direction (e.g., Y direction). The common source line CSL may be doped with impurities of a second conductivity type (e.g., an n-type). A plurality of insulating layers IL may be provided on a region of the substrate SUB between two adjacent common source lines CSL and extend in the first direction. The plurality of insulating layers IL may be sequentially provided and spaced a specific (and/or alternatively predetermined) distance apart from one another in a third direction (e.g., a Z direction). For example, the plurality of insulating layers IL may include an insulating material, such as silicon oxide.

A plurality of pillars P may be provided on a region of the substrate SUB between two adjacent common source lines CSL and sequentially arranged in the first direction. The plurality of pillars P may penetrate the plurality of insulating layers IL in the third direction. For example, the plurality of pillars P may penetrate the plurality of insulating layers IL and contact the substrate SUB. Specifically, a surface layer S of each of, or at least some of, the pillars P may include a silicon material having a first type and function as a channel region. An inner layer I of each of, or at least some of, the pillars P may include an insulating material (e.g., silicon oxide) or an air gap.

A charge storage layer CS may be provided, in a region between two adjacent common source lines CSL, along exposed surfaces of the insulating layers IL, the pillars P, and the substrate SUB. The charge storage layer CS may include a gate insulating layer (or referred to as a 'tunnelling insulating layer'), a charge trap layer, and a blocking insulating layer. For example, the charge storage layer CS may have an oxide-nitride-oxide (ONO) structure. Also, gate electrodes GE, such as the selection lines GSL and SSL and the word lines WL1 to WL8, may be provided on exposed surfaces CS in a region between two adjacent common source lines CSL.

Drains or drain contacts DR may be provided on the plurality of pillars P, respectively. For example, the drains or drain contacts DR may include a silicon material doped with impurities having a second conductivity type. Bit lines BL1 to BL3 may be provided on the drains DR. The bit lines BL1 to BL3 may extend in a second direction (e.g., an X direction) and be spaced a specific (and/or alternatively predetermined) distance apart from one another in the first direction.

Figure 17:
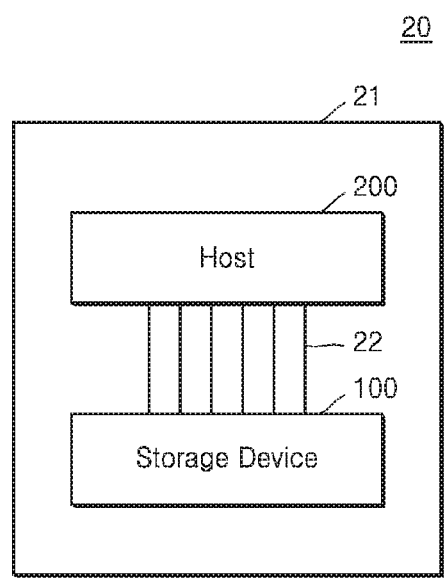
FIG. 17 is a block diagram illustrating an example in which a storage system according to an example embodiment is mounted on a circuit board.

FIG. 17 is a block diagram illustrating an example in which a storage system 20 according to an example embodiment is mounted on a circuit board.

Referring to FIG. 17, the storage system 20 may include a host 200 and a storage device 100, and the host 200 and the storage device 100 may be mounted on the same circuit board 21. Other components, such as a power supply circuit (not shown) and/or the like, may be mounted on the circuit board 21.

The storage device 100 may be, for example, a ball grid array-solid state drive (BGA-SSD), an eMMC, or a UFS. The storage device 100 may transmit or receive signals to or from the host 200 via signal lines 22 on the circuit board 21.

As described above, the storage device 100 may generate trace data when a trigger condition occurs and store the trace data in a non-volatile memory. Accordingly, acquiring trace data in an environment where it is difficult to connect an external device to the storage device 100 may be more easily accommodated, as in the current example embodiment.

Figure 18:
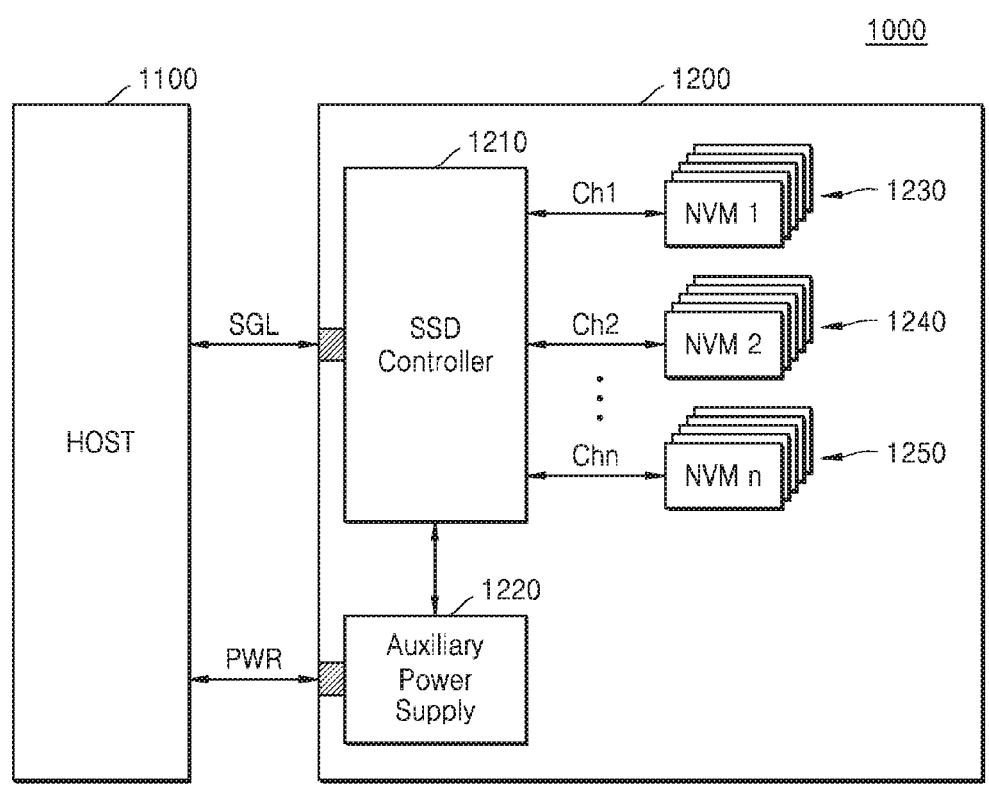
FIG. 18 is a block diagram of a solid state drive (SSD) system according to an example embodiment.

FIG. 18 is a block diagram of an SSD system 1000 according to an example embodiment.

Referring to FIG. 18, the SSD system 1000 may include a host 1100 and an SSD 1200. The SSD 1200 exchanges signals with the host 1100 through a signal connector and receives power through a power connector. The SSD 1200 may include an SSD controller 1210, an auxiliary power supply 1220 and a plurality of memory devices 1230, 1240, and 1250. Although not shown, the SSD 1200 may further include a buffer.

The plurality of memory devices 1230, 1240, and 1250 may be non-volatile memory devices. In an example embodiment, at least one of the plurality of memory devices 1230, 1240, and 1250 may include a 3D flash memory cell array.

One of the storage devices 100, 100a, 100b, 100c, 100d, 100e, 100f, 100g, and 100h may be implemented as the SSD 1200. Accordingly, the SSD 1200 may internally generate trace data and may store the generated trace data in at least one of the plurality of memory devices 1230, 1240, and 1250.

Figure 19:
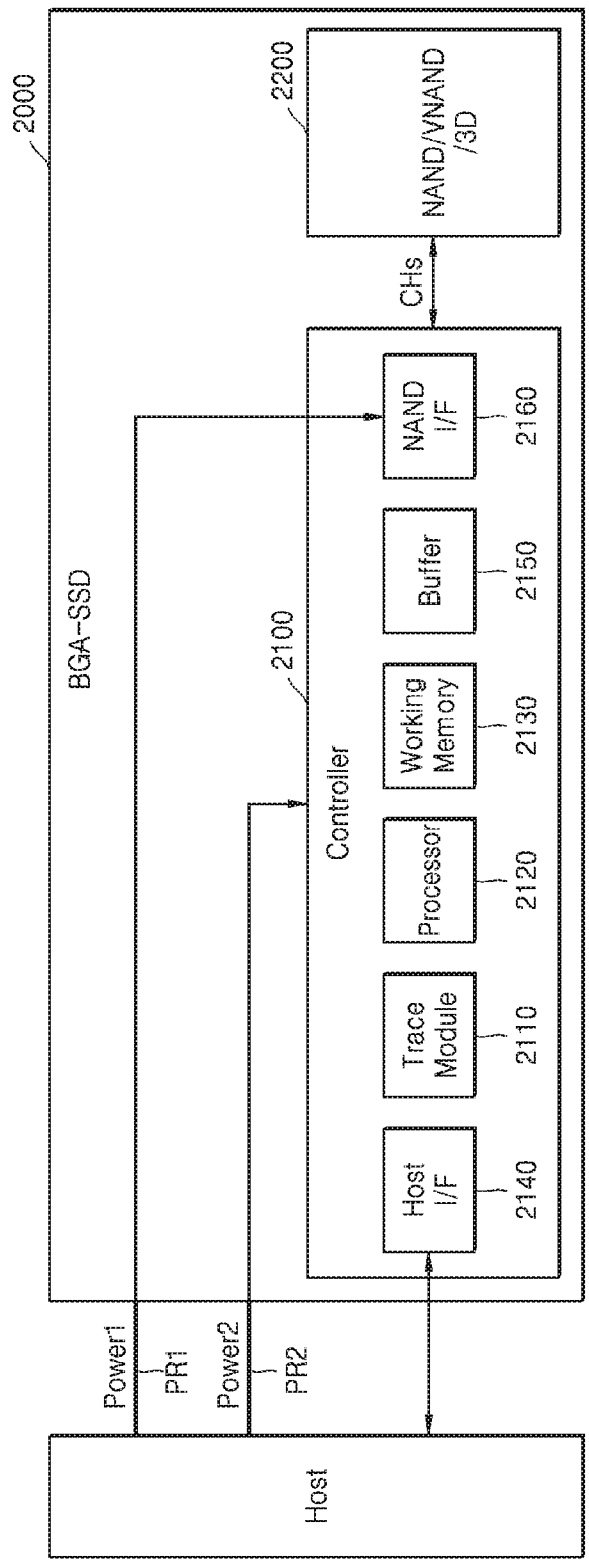
FIG. 19 is a block diagram of a ball grid array-solid state drive (BGA-SSD) according to an example embodiment.

FIG. 19 is a block diagram of a BGA-SSD 2000 according to an example embodiment.

Referring to FIG. 19, the BGA-SSD 2000 may receive electric powers, e.g., a first electric power Power1 and a second electric power Power2, from a host through power rails, e.g., a first power rail PR1 and a second power rail PR2, and may communicate with the host. The BGA-SSD 2000 may be mounted on the same circuit board as the host, and may communicate with the host through signal lines formed on the circuit board and receive the first and second electric powers Power1 and Power2 from the host. The BGA-SSD 2000 may include a controller 2100 and at least one NAND flash memory device 2200.

The NAND flash memory device 2200 may include a vertical NAND flash memory device or a 3D NAND flash memory device. The NAND flash memory device 2200 may include a plurality of NAND flash memory chips and may be connected to the controller 2100 through a plurality of channels CHs.

The controller 2100 may be connected to the NAND flash memory device 2200 through a channel. The controller 2100 may include a trace module 2110, at least one processor 2120, RAM 2130, a host interface 2140, a buffer 2150 and a NAND interface 2160. In addition, the controller 2100 may further include other components such as a DMA controller. The storage controllers 110, 110a, 110b, 110c, 110d, 110e, 110f, 110g, and 110h according to the example embodiments described above may be applied to the controller 2100. Accordingly, the trace module 2110 may generate trace data of the controller 2100. The trace module 2110 may generate trace data for the operation of each of, or at least some of, other internal components, trace data for transmission/reception signals between components, or trace data for a protocol between the host interface 2140 and the host.

The trace module 2110 may generate trace data when an operation error of the BGA-SSD 2000 occurs or a specific (and/or alternatively predetermined) trigger condition occurs. Alternatively or additionally, the trace module 2110 may generate trace data all the time or in response to a trace request, and the trace data may be stored in the NAND flash memory device 2200 when the trigger condition described above occurs.

The components of the BGA-SSD 2000 of FIG. 19 may be similarly applied to an eMMC, an embedded UFS, and the like.

Figure 20:
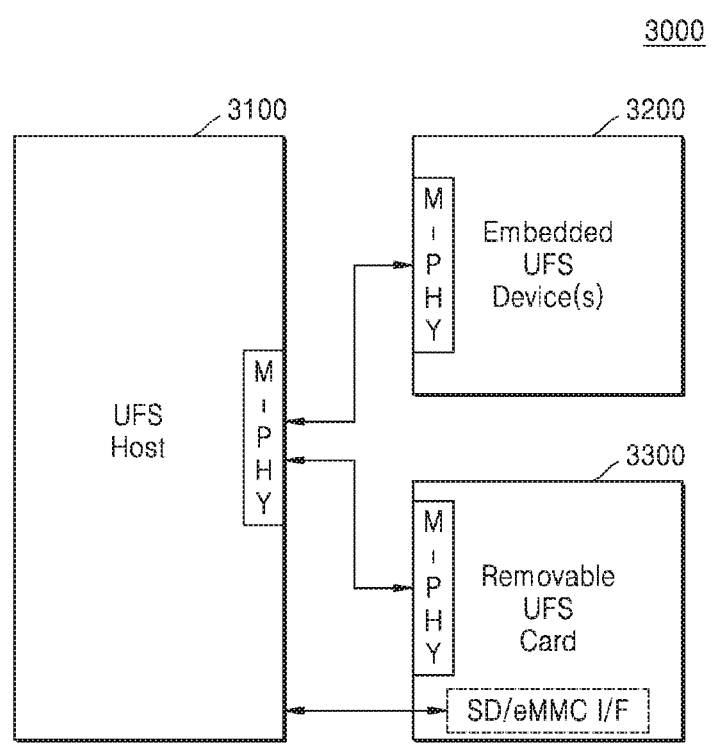
FIG. 20 is a block diagram of a universal flash storage (UFS) system according to an example embodiment.

FIG. 20 is a block diagram of a UFS system 3000 according to an example embodiment.

Referring to FIG. 20, the UFS system 3000 includes a UFS host 3100 and at least one embedded UFS device 3200, and may further include a detachably attached UFS card 3300. Communication between the UFS host 3100 and the embedded UFS device 3200 and communication between the UFS host 3100 and the detachably attached UFS card 3300 may be performed through an M-PHY layer.

At least one selected from the embedded UFS device 3200 and the detachably attached UFS card 3300 may use a storage system according to any one of the example embodiments described above and may be implemented to generate and store trace data internally.

The UFS host 3100 and the detachably attached UFS card 3300 may have bridges to communicate with each other by a protocol other than a UFS protocol. The UFS host 3100 and the detachably attached UFS card 3300 may communicate with each other by various card protocols (e.g., UFDs, MMC, eMMC secure digital (SD), mini SD, and micro SD).

While inventive concepts have been particularly shown and described with reference to example embodiments thereof, it will be understood that various changes in form and details may be made therein without departing from the spirit and scope of the following claims.

What is claimed is:

1. A storage device comprising:
   a non-volatile memory including a plurality of non-volatile memory cells;
   a processor configured to control an operation of storing data received from a host in the non-volatile memory;
   a host interface configured to transmit and to receive the data and control signals to and from the host; and
   a trace module configured to generate trace data for the processor or the host interface during an operation of the processor or the host interface, the trace module being configured to provide the trace data to the non-volatile memory, wherein
   the trace module is configured to monitor transmission/reception signals between the host and the host interface and the trace module is configured to generate protocol trace data according to a protocol trace as the trace data.

2. The storage device of claim 1, wherein the trace module is configured to generate the trace data if a trigger condition for generating and storing trace data occurs in the storage device, and the trace module is configured to provide the generated trace data to the non-volatile memory.

3. The storage device of claim 1, wherein
the trace module is configured to continuously generate the trace data,
and if a trigger condition occurs in the storage device, the non-volatile memory is configured to store some of a plurality of pieces of trace data generated before and after the trigger condition occurs.

4. The storage device of claim 3, wherein the non-volatile memory is configured to store trace data, generated in a first period before the trigger condition occurs and a second period after the trigger condition occurs.

5. The storage device of claim 3, further comprising:
a buffer configured to temporarily store the plurality of pieces of trace data,
wherein the buffer is configured to transmit at least some of the plurality of pieces of trace data to the non-volatile memory if the trigger condition occurs.

6. The storage device of claim 1, wherein
if a trigger condition occurs, the trace module is configured to generate the trace data or the non-volatile memory is configured to store the trace data, and
the trigger condition includes at least one of an operation error of the storage device, a specific event or condition, and a trigger control signal reception from the host or from an external device.

7. The storage device of claim 1, wherein
the trace module is further configured to monitor an operation of the processor or transmission/reception signals of the processor, and
the trace module is further configured to generate processor trace data according to a processor trace as the trace data.

8. The storage device of claim 1, wherein the storage device is on a same substrate as the host.

9. A storage device comprising:
a storage controller including a plurality of intellectual properties (IPs), a processor, and a trace module separate from the processor, the storage controller configured to generate trace data for at least one of the processor or the plurality of IPs, and the storage controller is configured to output the trace data; and
a non-volatile memory integrated with the storage controller, the non-volatile memory configured to store user data provided from a host and the trace data provided from the storage controller, wherein,
the trace module is configured to monitor an operation of the processor or transmission/reception signals of the processor, and generate processor trace data according to a processor trace as the trace data.

10. The storage device of claim 9, wherein
the trace module is further configured to trace an operation or transmission/reception signals of at least one of the plurality of IPs, and the trace module is configured to generate the trace data according to the tracing of the operation or the transmission/reception signals of the at least one of the plurality of IPs.

11. The storage device of claim 9, wherein
the storage controller is configured to generate the trace data if a trigger condition occurs, and
the storage controller is configured to store the generated trace data in the non-volatile memory.

12. The storage device of claim 9, wherein
the storage controller is configured to generate the trace data in response to a trace enable signal, and
the storage controller is configured to store at least some of the trace data in the non-volatile memory if a trigger condition occurs.

13. The storage device of claim 12, further comprising:
a buffer configured to store the trace data output from the storage controller, wherein
the buffer is configured to provide at least some of the stored trace data to the non-volatile memory if the trigger condition occurs.

14. The storage device of claim 9, wherein, if an operation error occurs or a specific event or condition occurs, the storage controller is configured to generate the trace data or stores the trace data in the non-volatile memory.

15. The storage device of claim 9, wherein the storage controller is configured to store the protocol trace data in the non-volatile memory if an error occurs in the protocol or if a specific event occurs on the protocol.

16. The storage device of claim 9, wherein the storage device is one of a solid state drive (SSD), an embedded multi-media card (eMMC), and a universal flash storage (UFS).

17. The storage device of claim 9, wherein the non-volatile memory includes a three-dimensional flash memory cell array.

18. A storage controller comprising:
a plurality of intellectual properties (IPs),
the plurality of IPs including a processor configured to control storing data in a non-volatile memory in response to a write request received from a host;
the plurality of IPs including a host interface configured to transmit and to receive the data and control signals to and from the host; and
a trace module configured to monitor an operation of the processor or transmission/reception signals of the processor, and generate trace data based on monitoring an operation or transmission/reception signal of the processor, the trace module being configured to provide the trace data to the non-volatile memory.

19. A storage device comprising:
the storage controller of claim 18; and
the non-volatile memory.

* * * * *